United States Patent [19]

Aomura

[11] 4,283,733

[45] Aug. 11, 1981

[54] SEMICONDUCTOR INTEGRATED CIRCUIT DEVICE INCLUDING ELEMENT FOR MONITORING CHARACTERISTICS OF THE DEVICE

[75] Inventor: Kunio Aomura, Tokyo, Japan

[73] Assignee: Nippon Electric Co., Ltd., Tokyo, Japan

[21] Appl. No.: 73,250

[22] Filed: Sep. 7, 1979

Related U.S. Application Data

[60] Division of Ser. No. 943,913, Sep. 20, 1978, which is a continuation of Ser. No. 746,744, Dec. 2, 1976, abandoned.

[30] Foreign Application Priority Data

Dec. 5, 1975 [JP] Japan .................. 50/145473

[51] Int. Cl.³ .................. H01L 23/48; H01L 29/44; H01L 29/52
[52] U.S. Cl. .................. 357/68; 357/65; 357/67; 357/59; 357/51; 357/35; 357/36
[58] Field of Search .................. 357/59, 68, 67, 71, 357/65, 51, 35, 36; 29/571, 574

[56] References Cited

U.S. PATENT DOCUMENTS

| 3,388,457 | 6/1968 | Totta | 29/574 |
|---|---|---|---|
| 3,465,427 | 9/1969 | Barson et al. | 29/574 |
| 3,514,845 | 6/1970 | Legat et al. | 357/59 |
| 3,519,901 | 7/1970 | Bean et al. | 357/59 |
| 3,632,436 | 1/1972 | Denning | 357/59 |
| 3,659,156 | 4/1972 | Beneking | 357/59 |
| 3,699,646 | 10/1972 | Vadasz | 29/571 |
| 3,847,687 | 11/1974 | Davidsohn | 357/59 |
| 3,881,242 | 5/1975 | Nuttall | 357/59 |
| 3,902,188 | 8/1975 | Jacobson | 357/59 |
| 4,029,527 | 6/1977 | Glasi et al. | 357/59 |

FOREIGN PATENT DOCUMENTS 2353803  5/1974  Fed. Rep. of Germany .......... 357/59

Primary Examiner—Andrew J. James
Attorney, Agent, or Firm—Hopgood, Calimafde, Kalil, Blaustein & Lieberman

[57] ABSTRACT

A semiconductor device includes terminals for use in monitoring characteristics of circuit elements formed therein. The terminals are formed of a layer of polycrystalline silicon and terminate in an enlarged area pad portion adapted to be contacted by a probe of an external characteristics-monitoring apparatus.

11 Claims, 19 Drawing Figures

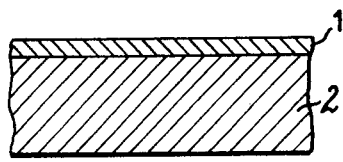
FIG.I(A)
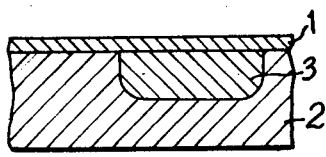
FIG.I(B)
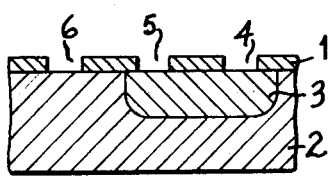
FIG.I(C)
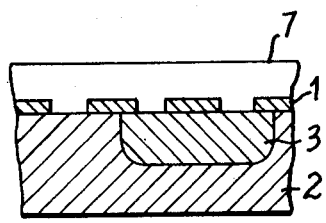
FIG.I(D)
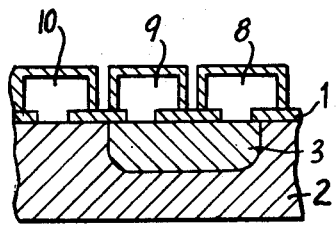
FIG.I(E)
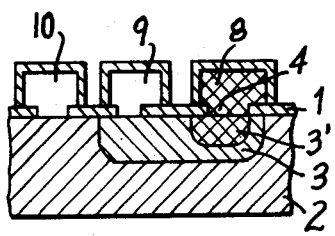
FIG.I(F)
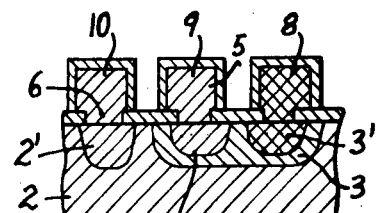
FIG.I(G)
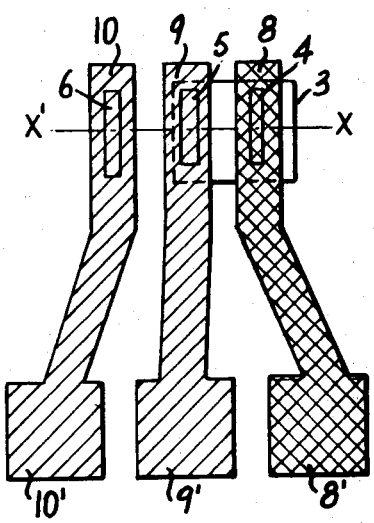
FIG.I(H)

SEMICONDUCTOR INTEGRATED CIRCUIT DEVICE INCLUDING ELEMENT FOR MONITORING CHARACTERISTICS OF THE DEVICE

This is a Divisional of pending prior application Ser. No. 943,913 filed Sept. 20, 1978, which is a continuation of Ser. No. 746,744 filed Dec. 2, 1976, now abandoned.

This invention relates generally to semiconductor devices, and particularly to a semiconductor integrated circuit device having a semiconductor element for monitoring characteristics of the device.

In a semiconductor integrated circuit device, one or more auxiliary semiconductor elements are provided for the purpose of monitoring or measuring characteristics of the semiconductor elements included in the device. The size and structure of such auxiliary element should be preferably the same as those of the element to be monitored. However, recently developed semiconductor elements of a highly reduced size make it impossible to contact the probes of a measuring apparatus directly onto the surface of the element. Therefore, monitoring of the characteristics of elements in an integrated circuit device has been recently done by way of either (1) using external lead-out electrodes furnished to the same-sized auxiliary element or (2) resorting to a large-sized auxiliary element whose characteristics are correlated with those of a small-sized element to be monitored. In the latter method (2) the characteristics of the element to be monitored must be calculated and estimated from those measured of the large-sized auxiliary element and therefore this method is complicated and inaccurate. The former method (1) can readily determine the characteristics of the element with accurancy but the characteristics of the element cannot be modified to their desired values, because the aluminum that is commonly employed for the external lead-out electrodes cannot stand the treatments that are necessary for modifying the characteristics of the element.

A polycrystalline silicon layer is widely used in a semiconductor integrated circuit device, for example, as a gate electrode of an insulated-gate field-effect transistor, as an impurify source for diffusion and an electrode of the diffused region in a bipolar transistor, or as a thin film resistor. The characteristics of such semiconductor devices using a polycrystalline silicon layer, however, cannot be ascertained until the metallic electrodes for external lead-out are formed, and at that stage, modification of the characteristics is impossible.

An object of this invention is, therefore, to provide a semiconductor device in which the characteristics of an element involved therein can be readily monitored and modified.

Another object of this invention is to provide a semiconductor integrated circuit device including a semiconductor element with external lead-out electrodes for monitoring, which can be subjected to treatment of modify its characteristics.

A further object of this invention is to provide a method of manufacturing a semiconductor device, in which the characteristics of an element involved in the device can be determined through a monitoring element and subsequently modified to desired values.

This invention is featured by the use of a polycrystalline silicon layer for the external lead-out electrodes to be used for monitoring its characteristics of a semiconductor element included in a semiconductor integrated circuit device. The silicon external lead-out electrodes are connected to a monitoring semiconductor element, which is, in turn, formed in, or on, the same semiconductor substrate as the semiconductor integrated circuit device, and extended on an insulating film covering the semiconductor substrate to an area outside the area of the monitoring semiconductor element. The monitoring semiconductor element may be provided auxiliarily in addition to the elements constituting the integrated circuit, or it may be one constituting the integrated circuit device. The size and the structure of the monitoring semiconductor element are preferably the same as those of a semiconductor element to be monitored. According to this invention, probes of a measuring apparatus are contacted to the silicon external lead-out electrodes to measure the characteristics of the monitoring element and thereby to determine the characteristics of the element to be monitored. If the measured characteristics are not at their desired values, the device is subjected to an extra treatment of, for example, heat treatment or impurity addition to bring the characteristics to the desired values. The characteristics are again checked by contacting the probes to the silicon electrodes of the monitoring element. Thereafter, once the monitored characteristics are of the desired values, metallic electrodes or metallic wiring layers, if used, are formed on the device. With the monitoring terminal electrodes of silicon which can stand the high temperature of the characteristics-modifying treatment, both the monitoring and modifying of the characteristics can be carried out readily and accurately. Moreover, metallic electrodes or wiring layers can be used while carrying out both the monitoring and modifying processes.

Other features and objects of this invention will become more apparent from the following description of preferred embodiments of the invention, taking in conjunction with the accompanying drawings in which:

FIGS. 1A to 1G are cross sections of a monitoring bipolar transistor according to an embodiment of this invention in respective steps of manufacture;

FIG. 1H is a plan view of the transistor, FIG. 1G is a cross sectional view taken along the line X—X' of FIG. 1H;

Figure 2A:
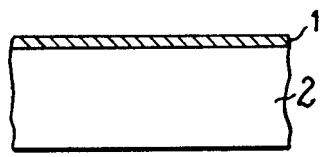
FIGS. 2A to 2F are cross sections of a monitoring resistor according to another embodiment of this invention is respective steps of manufacture.
Figure 2B:
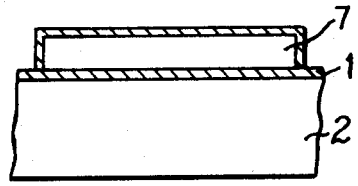
Figure 2C:
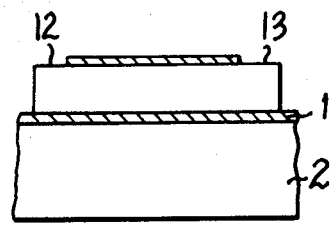

In a first embodiment of this invention shown in FIG. 1, the surface of an N-type silicon substrate 2 is thermally oxidized and thereby covered with a silicon oxide film 1 (FIG. 1A). Then, an opening (not shown) is formed in the silicon oxide film 1 to partially expose the surface of the substrate 2 and boron atoms are diffused through that opening into the N-type silicon substrate to form a P-type base region 3 there, the surface thereof being covered with a silicon oxide film 1 (FIG. 1B). Then, openings 4, 5 and 6 are formed in the silicon oxide film 1 (FIG. 1C). The openings 4, 5 and 6 are used to enable ohmic connections between silicon lead-out electrodes and the base, emitter and collector regions of a monitoring transistor, respectively, in subsequent steps.

A layer of polycrystalline silicon 7 is then deposited the of thermal decomposition of monosilane over the substrate surface, that is, on the silicon oxide film 1 and in the openings 4, 5 and 6 (FIG. 1D). The polycrystalline silicon layer 7 is then selectively removed to form polycrystalline silicon external lead-out electrodes 8, 9 and 10 for the base, emitter, and collector, respectively and the surfaces of the respective silicon electrodes 8, 9 and 10 are covered with a silicon oxide film by thermal oxidation (FIG. 1E). Referring also to FIG. 1H, the silicon electrodes, 8, 9 and 10 are connected respectively to the base region 3, the prospective emitter region, and the collector region 2 and extend on the surface of the silicon oxide film 1. Each of the silicon electrodes 8, 9 and 10 extends on the oxide film 1 to an area outside the active area of a monitoring transistor element and there terminates in a pad portion 8′, 9′, 10′ of a wide area adapted to receive a probe of a measuring apparatus. The area of the pad portion and the distance of the adjacent pad portions are determined to ensure that one probe of a measuring apparatus contacts exclusively a single pad portion.

The oxide film covering the base lead-out electrode 8 is then removed and boron atoms are diffused through the base electrode 8 of polycrystalline silicon via the base opening 4 into the P-type base region 3 to form a P+-type base contact region 3′ therein, the surface of the base electrode 8 being again covered with an oxide film by thermal oxidation (FIG. 1F). The oxide films covering the emitter and collector lead-out electrodes 9 and 10 are then removed, and phosphorus atoms are diffused through the emitter and collector electrodes 9 and 10 via the emitter and collector openings 5 and 6 into the base region 3 and the collector region 2, respectively, to form an N-type emitter region 11 in the base region 3 and an N+-type collector contact region (FIG. 1G).

The silicon electrodes 8 and 10 are sufficiently doped with an N-type impurity, e.g. phosphorus and covered with an oxide film. The oxide films covering the silicon lead-out electrodes 8 to 10 are removed at least from the surface of the respective pad portions 8′ to 10′, and by contacting probes of a measuring apparatus to the exposed pad portions 8′ to 10′ of the silicon lead-out electrodes 8 to 10 as the monitoring terminals, characteristics of this monitoring transistor, such as its emitter-grounded current gain $h_{FE}$, are measured. If the measured characteristics are lower than the desired values, further diffusion of impurity or impurities is performed. For instance, when phosphorus was diffused at a temperature of 1000° C. for 25 minutes through the emitter and collector electrodes 9 and 10 of the silicon layer of approximately 0.5 μm thick to form an emitter region 11 having a spare area of 4×4 μm with a distance of 0.8 μm from the collector region 1, the current gain $h_{FE}$ measured was 20. Since this value was lower than the desired one, the device was heated at a temperature of 1000° C. for 30 minutes in a nitrogen atmosphere to diffuse phosphorus doped in the emitter electrode 9 into the emitter region 11. As a result of measurement by use of the silicon lead-out electrodes 8, 9 and 10, the current gain $h_{FE}$ was increased to 60. Under such high temperature treatment, aluminum electrodes would have been melted out.

In a second embodiment of the invention shown in FIG. 2, a semiconductor substrate 2 is thermally oxidized to form an oxide film 1 (FIG. 2A). A polycrystalline silicon layer 7 is then deposited on the oxide film 1 by thermal decomposition of monosilane and is selectively removed to form a resistor element with terminal portions (FIG. 2B). Referring to FIG. 2G, the terminal portions 12 and 13 connect to both ends of the body 14 of the resistor element and extend on the oxide film 1 to pad portions 12′ and 13′ having a wide area which serve as monitoring terminal electrodes. The whole surface of the silicon resistor element is covered with an oxide film by thermal oxidation.

Figure 2D:
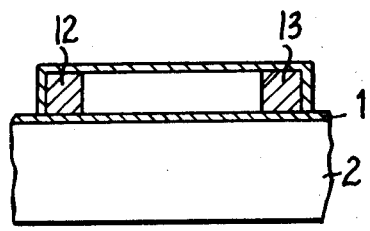
Figure 2E:
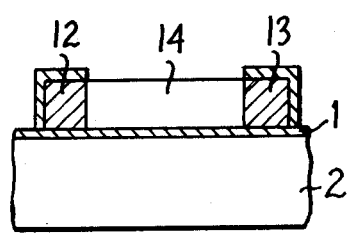
Figure 2F:
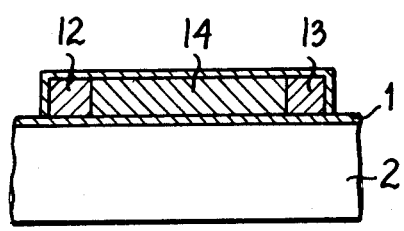
Figure 2G:
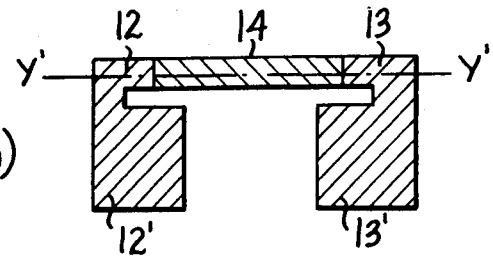
FIG. 2G is a plan view thereof and, FIG. 2F is a cross-sectional view taken along the line Y—Y' of FIG. 2G.

The oxide film covering the silicon resistor element is then selectively removed from both end terminal portions 12 and 13 (including pad portions 12′ and 13′) of the silicon resistor element (FIG. 2C), and boron is diffused in to the exposed end terminal portions 12 and 13 to convert them into highly-doped low-resistance regions (FIG. 2D). The end terminal portions are again covered with an oxide film. Then, the body 14 of the silicon resistor element is exposed (FIG. 2E) and doped with boron atoms of a controlled amount by ion implantation to gain a desired resistivity value and is again covered with a silicon oxide film (FIG. 2F).

The pad portions 12′ and 13′ of the terminal of the resistor element are exposed and probes of a testing apparatus are put into contact thereto to measure the resistivity of the monitoring resistor element. If the resistivity is found to be lower than a desired value, the thickness of the silicon layer at the body 14 of the monitoring resistor and of another resistor to be monitored which has been formed on the same oxide film 1 at the same time and by the same process as the fabrication of the monitoring resistor is reduced to enhance the resistivity. If the measured value of resistance is higher than the desired value, impurities are further introduced into the body 14 of the resistors to reduce the resistivity.

Figure 3A:
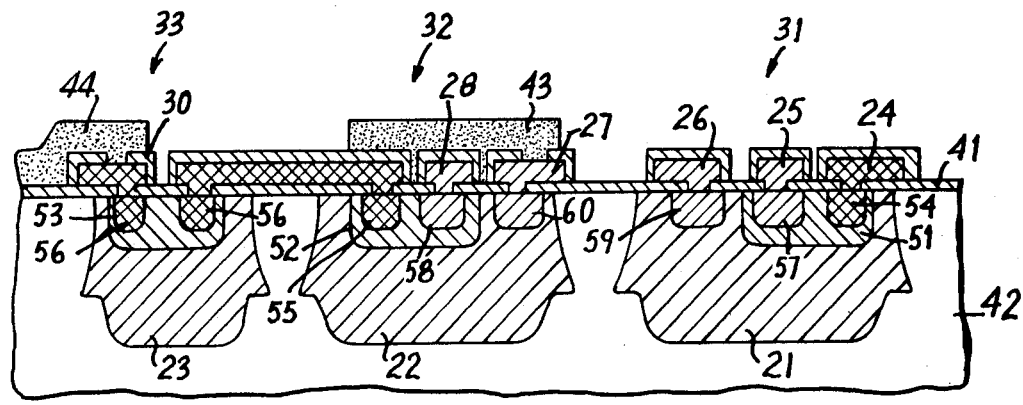
FIGS. 3A is a cross sectional view along the line Z—Z' of FIG. 3B showing a part of an integrated circuit device including a monitoring transistor according to this invention.
Figure 3B:
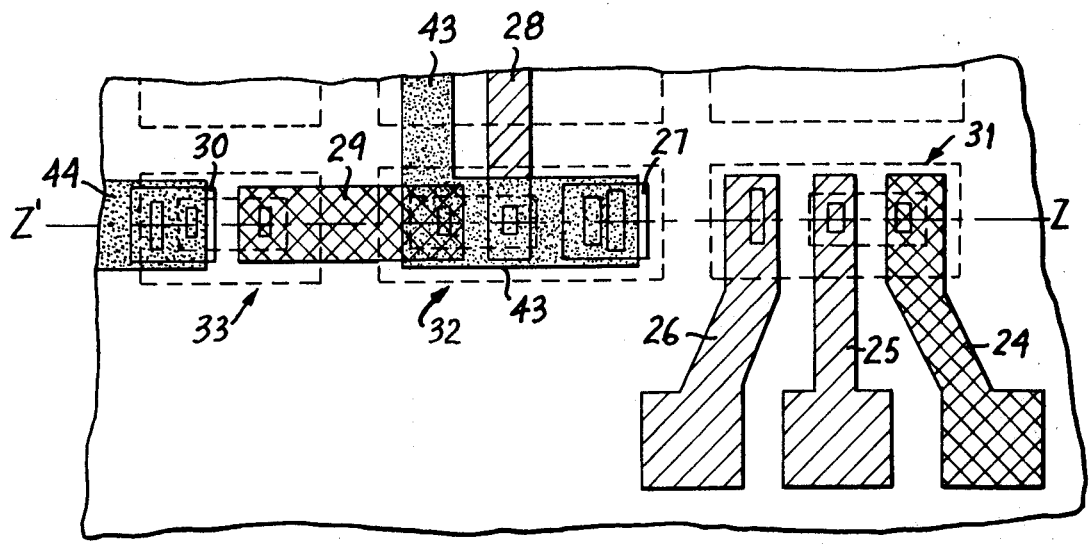
FIG. 3B is a plan view thereof.

FIG. 3 shows a part of a semiconductor integrated circuit device in which a monitoring bipolar transistor 31 is incorporated together with semiconductor circuit elements, such as a bipolar transistor 32 and a diffused resistor 33, of the integrated circuit. These circuit elements are formed in a single semiconductor substrate 42 and are isolated from each other by P-N junctions. In detail, a plurality of N-type island regions 21, 22, 23 are formed in the P-type silicon substrate 42. In one island 21, the monitoring transistor 31 having the same structure as that of the embodiment of FIG. 1 is formed in the same manner as the embodiment of FIG. 1, with its base lead-out electrode 24, emitter lead-out electrode 25 and collector lead-out electrode 26 all formed of polycrystaline silicon. In another island 22, the bipolar transistor 32 of the same type as the monitoring transistor 31 is formed with its silicon collector electrode 27, its silicon emitter electrode 28 extending to another element and its silicon base electrode 29 extending on an oxide film 41 covering the substrate 42 to and connected to one terminal of the diffused resistor 33. An aluminum wiring layer 43 is connected to the silicon collector electrode 27 and extends to another element. The other terminal of the resistor 33 is connected to another element through a silicon electrode 30 and an aluminum wiring layer 44. The P-type base region 51 of the monitor transistor 31, the P-type base region 52 of the circuit transistor 32, and the P type resistor region 53 are formed at the same time in the N-type islands 21, 22, and 23, respectively. Then, the silicon electrodes 24 to 30 are formed at the same time. P+-type base contact regions 54 and 55 and P+-type resistor contact regions 56 are then formed also at the same time and N+-type emitter regions 57 and 58 and N+-type collector contact regions 59 and 60 are all formed simultaneoulsy. Thereafter, the characteristics of the monitoring transistor 31 are measured by the use of the monitoring terminals 24, 25 and 26 formed of silicon to monitor the characteristics of the circuit transistor 32, and, if necessary, the characteristics of the transistors 31 and 32 are modified at the same time. Then, the aluminum wiring layers 43 and 44 are formed on the substrate 42. Since the transistor 32 used in the integrated circuit is of the same type as, and is formed at the same time as, the monitoring transistor 31, its characteristics can be monitored through the monitoring transistor 31 and controlled accurately. Moreover, the use of the silicon lead-out electrodes 24, 25 and 26 as monitoring terminals makes it possible to modify and control the characteristics of the transistors 31 and 32 accurately in the course of manufacture.

Figure 4:
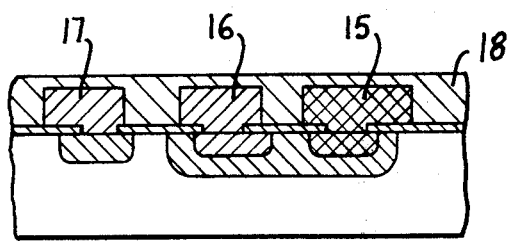
FIG. 4 is a cross-sectional view of another monitoring transistor according to this invention.
Figure 5:
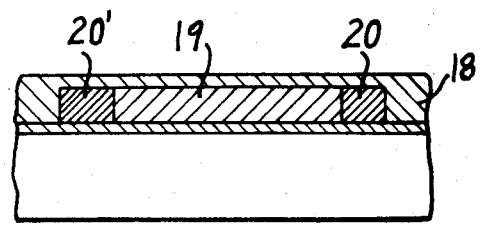
FIG. 5 is a cross sectional view of another monitoring resistor according to this invention.

Referring to FIGS. 4 and 5, which are respective modifications of the embodiments of FIGS. 1 and 2, polycrystalline silicon lead-out electrodes 15, 16 and 17 of a monitoring transistor (and, of a circuit transistor to be monitored) and end terminal portions 20 and 20' and a body portion 19 of silicon of a monitoring resistor (and of a resistor to be monitored) are embedded in a silicon oxide layer 18 which is formed by the selective oxidation of a silicon layer rather than by the selective removal thereof. This structure makes the surface of the device flat.

The monitoring transistor and the monitoring resistor of the invention may be used as circuit elements constituting an integrated circuit. In such case, the silicon lead-out electrodes 8, 9 and 10, 12, 13, 15 16, and 17, 22, 20', and 24, 25 and 26 are connected to other elements by way of, e.g., aluminum wiring layers. Where these silicon lead-out electrodes are solely used for characteristics-monitoring, they may be retained as they are after monitoring or they may be removed by etching or converted into oxide after monitoring.

What is claimed is:

1. A semiconductor device comprising a semiconductor substrate, a plurality of circuit elements in said substrate, each of said circuit elements including a first semiconductor region of said substrate, at least one monitoring circuit element formed in said substrate and including a second semiconductor region of said substrate having substantially the same structure and size as said first semiconductor region of said circuit element to be monitored, an insulating film covering at least a portion of the major surface of said substrate, a characteristic-monitoring electrode of a silicon layer connected to said second semiconductor region of said monitoring circuit element and extending on said insulating film, said characteristic monitoring electrode having a portion on said silicon layer on said insulating film remote from said monitoring circuit element and adapted to receive a probe of a characteristics-measuring apparatus, and a metallic layer electrically connected to said first semiconductor region of said circuit element to be monitored.

2. The semiconductor device of claim 1, in which the area of said portion is greater than the areas of the other parts of said characteristic-monitoring electrodes.

3. The semiconductor device of claim 1, in which said each of said characteristic-monitoring electrodes of said silicon layer is embedded in a silicon oxide layer formed by the selective oxidation of said silicon layer.

4. A semiconductor device comprising a semiconductor substrate, a plurality of transistor elements formed in said substrate, each of said transistor elements including a first base region, a first emitter region, and a first collector region in said substrate, at least one monitoring transistor element formed in said substrate and including a second base region, a second emitter region, and a second collector region in said substrate with substantially the same structure and size as said first base region, said first collector region, respectively, silicon electrodes formed on said first base region, said first emitter region and said first collector region, an insulating film selectively covering the major surface of said substrate, characteristic-monitoring electrodes of a silicon layer connected to said second base region, said second emitter region and said second collector region of said monitoring transistor element and extending on said insulating film, each of said characterstic-monitoring electrodes having a pad portion of said silicon layer on said insulating film remote from said monitoring transistor element and adapted to receive a probe of a measuring apparatus, and a metallic wiring layer connected to at least one of said silicon electrodes of said transistor element to be monitored.

5. The semiconductor device of claim 4, in which te thickness of said silicon electrodes of said transistor element is substantially equal to that of said characteristic-monitoring electrodes.

6. A semiconductor integrated circuit device comprising a semiconductor substrate of one conductivity type, a plurality of island regions of the opposite conductivity type isolated from said substrate by a P-N junction, a plurality of circuit elements respectively formed in said plurality of island regions, each of said circuit elements including a first semiconductor region in said island region, a monitoring element formed in another of said island regions and including a second semiconductor region in said another island region having substantially the same structure and size as said first semiconductor region of said circuit element to be monitored, a silicon electrode contacted to said first semiconductor region of said circuit element to be monitored, an insulating film selectively covering the major surface of said substrate, a characteristic-monitoring electrode of a silicon layer connected to said second semiconductor region of said monitoring element and extending on said insulating film, said characteristic-monitoring electrode having a pad portion of said silicon layer on said insulating film remote from said monitoring element and adapted to receive a probe of a measuring apparatus, and a metallic wiring layer electrically connected to said first semiconductor region via said silicon electrode of said circuit element to be monitored.

7. The semiconductor integrated circuit device of claim 6, in which the thickness of said silicon electrode of said circuit element is substantially equal to that of said characteristic-monitoring electrode.

8. The semiconductor integrated circuit device of claim 6, in which said one of said circuit elements is a bipolar transistor.

9. The semiconductor integrated circuit device of claim 6, in which said one of said circuit elements is a resistor.

10. The semiconductor device of claim 1, in which the temperature which said metallic layer is able to withstand is lower than the temperature which said silicon layer is able to withstand.

11. A semiconductor device comprising a semiconductor substrate, an insulating film on the major surface of said substrate, a monitoring resistor element of a polycrystalline silicon formed on said insulating film, and first and second monitoring terminal electrodes formed of said polycrystalline silicon and connected to first and second parts of said monitoring resistor element, respectively, and extending on said insulating film, each of said monitoring terminal electrodes having a portion of said polycrystalline silicon on said insulating film remote from said monitoring resistor and adapted to receive a probe of a charactertistics-measuring apparatus.

* * * * *